(12) United States Patent
Komatsu et al.

(10) Patent No.: US 11,217,513 B2
(45) Date of Patent: Jan. 4, 2022

(54) INTEGRATED CIRCUIT PACKAGE WITH PRE-WETTED CONTACT SIDEWALL SURFACES

(71) Applicant: TEXAS INSTRUMENTS INCORPORATED, Dallas, TX (US)

(72) Inventors: Daiki Komatsu, Beppu (JP); Makoto Shibuya, Beppu (JP)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/825,676

(22) Filed: Mar. 20, 2020

(65) Prior Publication Data

US 2020/0286816 A1 Sep. 10, 2020

Related U.S. Application Data

(62) Division of application No. 15/627,141, filed on Jun. 19, 2017, now Pat. No. 10,636,729.

(51) Int. Cl.
*H01L 21/56* (2006.01)
*H01L 23/495* (2006.01)
*H01L 23/00* (2006.01)
*H01L 21/78* (2006.01)
(Continued)

(52) U.S. Cl.
CPC ...... *H01L 23/49568* (2013.01); *H01L 21/563* (2013.01); *H01L 21/78* (2013.01); *H01L 22/12* (2013.01); *H01L 23/49541* (2013.01); *H01L 23/49582* (2013.01); *H01L 24/05* (2013.01); *H01L 24/45* (2013.01); *H01L 24/97* (2013.01); *H01L 21/561* (2013.01); *H01L 23/3107* (2013.01); *H01L 23/49548* (2013.01); *H01L 24/48* (2013.01); *H01L 2224/04042* (2013.01); *H01L 2224/32245* (2013.01); *H01L 2224/48091* (2013.01); *H01L 2224/48247* (2013.01); *H01L 2224/48465* (2013.01); *H01L 2224/73265* (2013.01); *H01L 2924/00014* (2013.01); *H01L 2924/181* (2013.01)

(58) Field of Classification Search
CPC ... H01L 23/49568; H01L 24/05; H01L 22/12; H01L 21/78; H01L 23/49582; H01L 24/45; H01L 23/49541; H01L 23/3107; H01L 21/563; H01L 2224/04042
See application file for complete search history.

(56) References Cited

U.S. PATENT DOCUMENTS 6,415,397 B1 7/2002 Co et al.
2005/0148160 A1 7/2005 Farnworth et al.
2011/0221057 A1 9/2011 Lin et al.
(Continued)

OTHER PUBLICATIONS

"The MY600 Jet Printer" P-001-0265, rev. 0001, Mycronic, Feb. 2015, pp. 1-18.
(Continued)

*Primary Examiner* — Selim U Ahmed
(74) *Attorney, Agent, or Firm* — Ronald O. Neerings; Charles A. Brill; Frank D. Cimino

(57) ABSTRACT

An integrated circuit (IC) package includes an encapsulation package that contains an integrated circuit die attached to a lead frame. A set of contacts is formed on the package that each have an exposed contact sidewall surface and an exposed contact lower surface. A protective layer of solder wettable material covers each contact sidewall surface.

17 Claims, 9 Drawing Sheets

(51) Int. Cl.
   *H01L 21/66*   (2006.01)
   *H01L 23/31*   (2006.01)

(56) References Cited

U.S. PATENT DOCUMENTS

| | | |
|---|---|---|
| 2014/0001616 A1 | 1/2014 | Daniels et al. |
| 2014/0191381 A1 | 7/2014 | Lee et al. |
| 2015/0076690 A1 | 3/2015 | Yoshino |
| 2016/0181122 A1* | 6/2016 | Eugene Lee ............ C25D 7/00 174/261 |
| 2016/0276251 A1 | 9/2016 | Mustanir et al. |
| 2017/0162530 A1* | 6/2017 | Lin ........................ H01L 21/78 |
| 2018/0145013 A1 | 5/2018 | Truhitte et al. |

OTHER PUBLICATIONS

Murray Roose, "The Value of Wettable Flank-Rated QFN Packaqing for Automotive Applications", Texas Instruments, Inc., Feb. 3, 2016, pp. 1-3.

* cited by examiner

INTEGRATED CIRCUIT PACKAGE WITH PRE-WETTED CONTACT SIDEWALL SURFACES

This application is a Divisional of application Ser. No. 15/627,141 filed Jun. 19, 2017.

FIELD OF THE DISCLOSURE

This disclosure relates to integrated circuit packages, and in particular to a package with pre-wetted contact sidewall surfaces.

BACKGROUND OF THE DISCLOSURE

Flat no-leads packages such as quad-flat no-leads (QFN) and dual-flat no-leads (DFN) physically and electrically connect integrated circuits to printed circuit boards. Flat no-leads, also known as micro leadframe (MLF) and SON (small-outline no leads), is a surface-mount technology, one of several package technologies that connect integrated circuits (ICs) to the surfaces of PCBs (printed circuit boards) without through-holes. Flat no-lead is a near chip scale plastic encapsulated package made with a planar copper lead frame substrate. Perimeter lands on the package bottom provide electrical connections to the PCB. Flat no-lead packages include an exposed thermal pad to improve heat transfer out of the IC and into the PCB.

To ensure that cars meet today's demand for safety and high reliability, the automotive industry requires original equipment manufacturers (OEMs) to perform 100% automatic visual inspection (AVI) on circuit board assemblies. In the case of quad-flat no-lead (QFN) packages, there are no easily viewed solderable pins/terminals that enable AVI to determine whether or not the package was successfully soldered on to the printed circuit board (PCB). The package edge has exposed copper for the terminals. These are prone to oxidation which makes sidewall solder wetting difficult.

SUMMARY OF THE DISCLOSURE

An integrated circuit (IC) package is disclosed that includes an encapsulation package that contains an integrated circuit die attached to a lead frame. A set of contacts is formed by the lead frame that each have an exposed contact sidewall surface and an exposed contact lower surface. A protective layer of solder wettable material covers each contact sidewall surface.

A method for performing automatic visual inspection (AVI) is disclosed. An integrated circuit (IC) package is soldered to pads on a substrate. The IC package has contacts, and each of contacts has a lower surface and a sidewall surface. A solder contour for each of the contacts on the IC package may be visually inspected. For each of the contacts on the IC package, the joint may be passed when the solder profile forms a fillet that substantially covers the contact sidewall, otherwise the joint may be failed when the solder profile does not form a fillet that substantially covers the contact sidewall.

BRIEF DESCRIPTION OF THE DRAWINGS

Particular embodiments in accordance with the disclosure will now be described, by way of example only, and with reference to the accompanying drawings.

Figure 1:
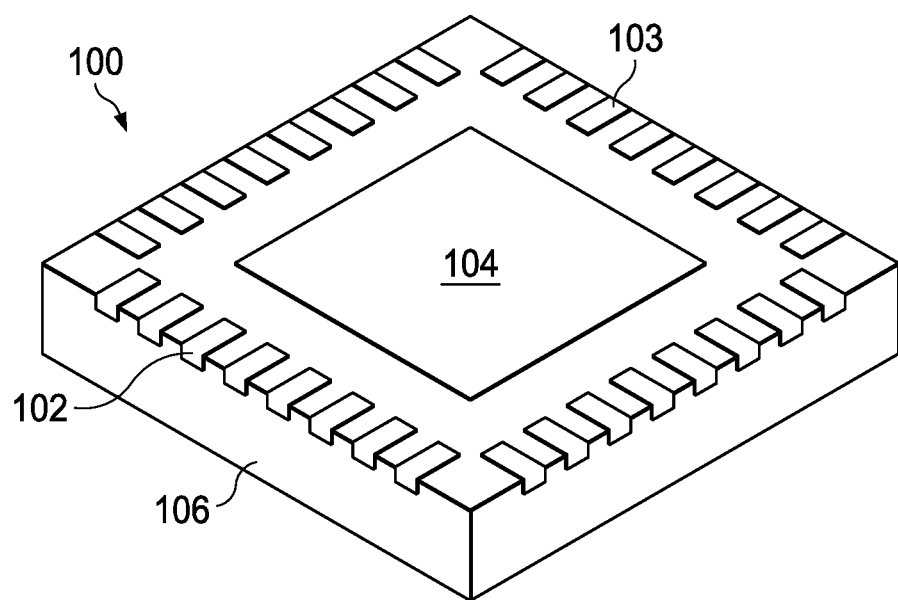
FIG. 1 is an illustration of a QFN IC package in which the contact sidewalls have been pre-tinned.

Other features of the present embodiments will be apparent from the accompanying drawings and from the detailed description that follows.

DETAILED DESCRIPTION OF EMBODIMENTS OF THE DISCLOSURE

Specific embodiments of the disclosure will now be described in detail with reference to the accompanying figures. Like elements in the various figures are denoted by like reference numerals for consistency. In the following detailed description of embodiments of the disclosure, numerous specific details are set forth in order to provide a more thorough understanding of the disclosure. However, it will be apparent to one of ordinary skill in the art that the disclosure may be practiced without these specific details. In other instances, well-known features have not been described in detail to avoid unnecessarily complicating the description.

Performing 100% AVI may be difficult with traditional QFN packages, because contact sidewall solder coverage may vary from 50-90%. An OEM may incur additional costs due to yield issues from false assembly failures, along with genuine fails where the assembly process has highlighted poor solder joints. AVI may be supplemented with X-ray imaging; however, the use of an X-ray machine to check for a good, reliable solder joint adds further expense. Furthermore, X-ray machines may not be available in some AVI systems.

An embodiment of the present disclosure may include a QFN package with contact sidewalls that are pre-tinned during package fabrication to allow reliable sidewall solder coverage that may be verified by AVI.

FIG. 1 is an illustration of a QFN IC package 100 in which the contact sidewalls have been pre-tinned. In this figure, the bottom side of QFN package 100 is illustrated. Flat no-leads packages such as quad-flat no-leads (QFN) and dual-flat no-leads (DFN) physically and electrically connect integrated circuits to printed circuit boards. Flat no-leads, also known as micro leadframe (MLF) and SON (small-outline no leads), is a surface-mount technology, one of several package technologies that connect ICs to the surfaces of PCBs without through-holes. Flat no-lead is a near chip scale plastic encapsulation package made with a planar copper lead frame substrate. Perimeter lands on the package bottom provide electrical connections to the PCB. Flat no-lead packages include an exposed thermal pad to improve heat transfer out of the IC (into the PCB). Heat transfer can be further facilitated by metal vias in the thermal pad. The QFN package is similar to the quad-flat package, and a ball grid array.

QFN package 100 includes a set of contacts arrayed around the perimeter of the package on the bottom side, such as contacts 102 and 103. Each of the contacts has an exposed surface on the bottom side of QFN package 100 and an exposed sidewall. Thermal pad 104 has an exposed surface on the bottom side of QFN 100. An integrated circuit die (not shown) is mounted to the other side of thermal pad 104. The entire assembly is encapsulated in a molding compound 106, such as various types of epoxy compounds, for example. While a QFN is illustrated in FIG. 1, other embodiments may use other types of integrated circuit packages that may include one or more contacts that may have a sidewall contact surface.

Figure 2:
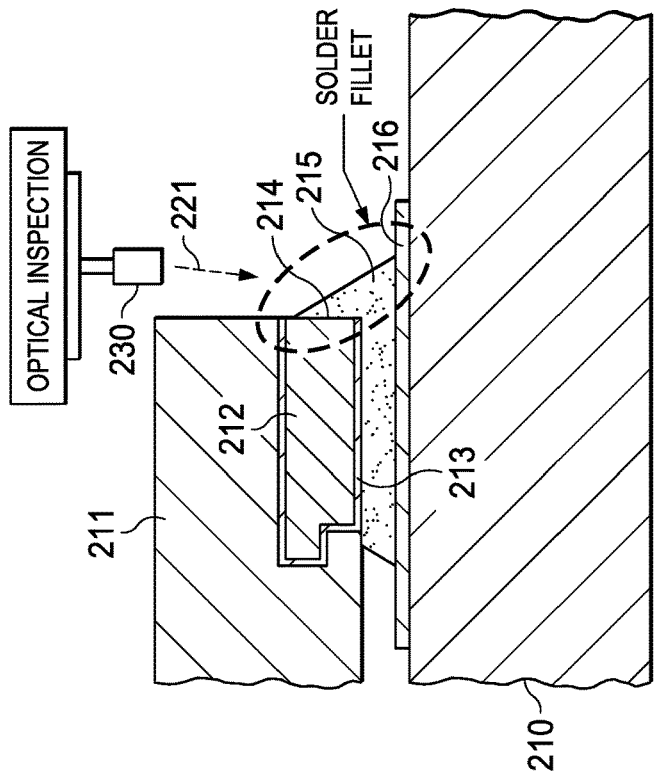
FIG. 2 is a side sectional view of a PCB with attached QFN packages, illustrating a problem with soldering QFN packages.

FIG. 2 is a side sectional view of a PCB 210 with attached QFN packages 211, 221, illustrating a problem with soldering QFN packages. This sectional view illustrates a portion of QFN 210211 that includes contact 212 and a portion of QFN 221 that includes contact 222. As mentioned above, each contact in a QFN package has an exposed contact lower surface 213, 223 and an exposed contact sidewall surface 214, 224.

During assembly of PCB 210, QFNs may be mounted to PCB 210 using solder, as indicated at 215, 225. After assembly of PCB 210, an AVI process may be performed using a camera such as indicated at 230. Camera 230 may be mounted on a robot arm that allows camera 230 to move over the surface of PCB 210 and visually inspect every solder joint. Alternatively, camera 230 may be fixed and PCB 210 may be mounted on a robot table that allows PCB 210 to be moved so that camera 230 can visually inspect every solder joint on PCB 210.

When a solder joint, such as solder joint 215, forms a smooth solder fillet that extends up the contact sidewall surface 214 from copper pad 216 and substantially covers the entire contact sidewall surface, it may be assumed that a good solder joint has formed between contact 212 and PCB pad 216. As used herein, the term "substantially covers" means that the solder fillet covers a majority of the contact sidewall surface, such as 90-95%, for example. Thus, when camera 230 is in view of solder joint 215, as indicated at 221, the AVI system may infer that a good solder joint has been formed based on the size and configuration of the solder fillet.

Contamination on contact sidewall surface 224, such as oxide formed on the copper surface, may inhibit solder wettability. In this case, contact sidewall surface 224 may remain exposed after the solder operation. It most cases, a good joint will still be formed between contact 222 and PCB pad 226 as long as the bottom surface 223 of contact 222 is not contaminated. However, in some cases a good solder joint may not be formed, such as when there is contamination on bottom surface 223, or when there is contamination on PCB pad 226, or when insufficient solder was applied, etc. Therefore, when a solder joint, such as solder joint 225, does not wick up contact sidewall surface 224, it is difficult to tell by visual inspection as indicated at 232 that a good solder joint has formed between contact 222 and PCB pad 226. Therefore, the joint may be failed when the solder profile does not include a fillet that covers a substantial portion of the contact sidewall.

Figure 3:
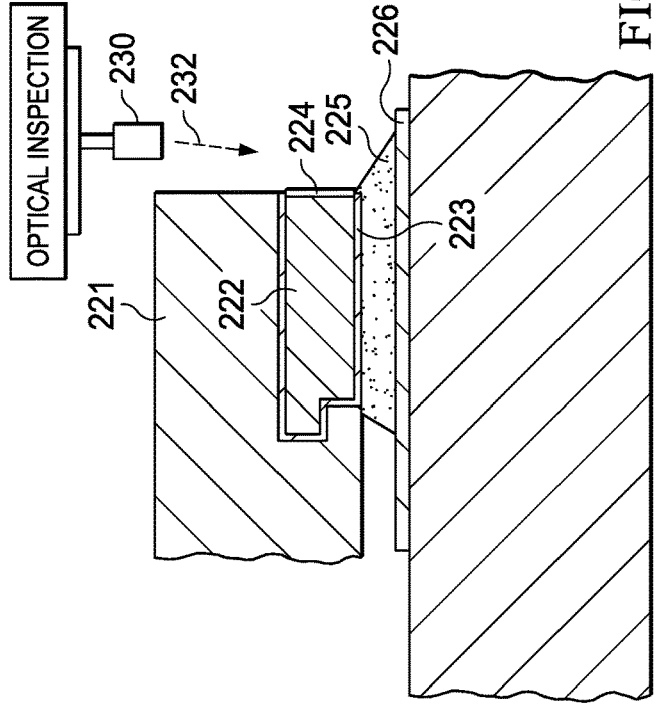
FIG. 3 is a top view of a lead frame strip that may be used to form the QFN of FIG. 1.

FIG. 3 is a top view of a lead frame strip 340 that may be used to form QFN 100 of FIG. 1. Lead frame strip 340 may include one or more arrays of individual lead frames. Lead frame strip 340 is typically fabricated from a copper sheet that is etched or stamped to form a pattern of thermal pads and contacts. Lead frame strip 340 may be plated with tin or another metal that will prevent oxidation of the copper and provide a lower contact surface that is easy to solder. An IC die may be attached to each individual lead frame, such as indicated at 341, 342.

Figure 4:
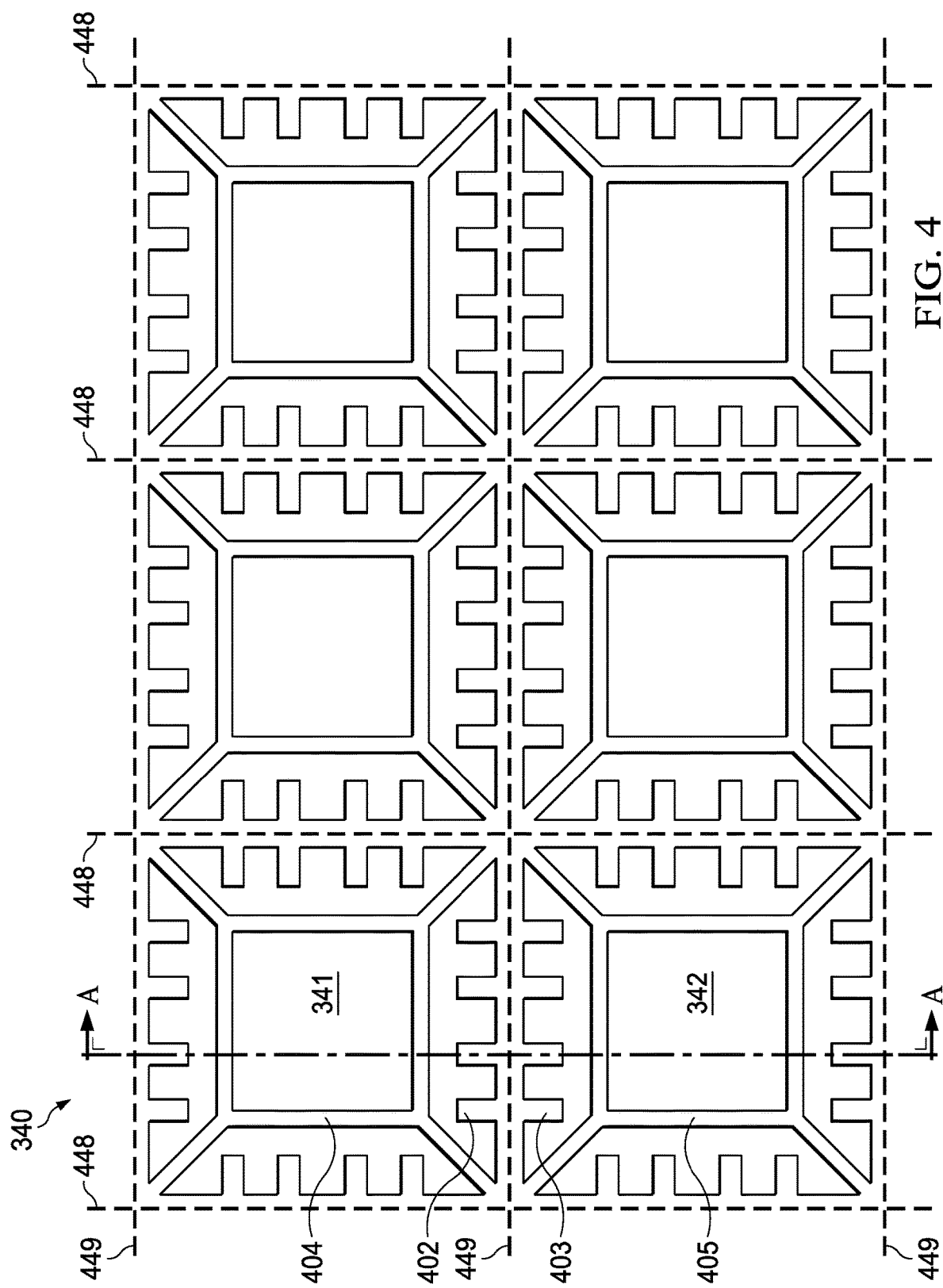
FIG. 4 is a more detailed view of a portion of the lead frame strip of FIG. 3.

FIG. 4 is a more detailed view of a portion of the lead frame strip 340. Each individual leadframe includes a thermal pad, such as thermal pads 404, 405. Each individual lead frame also includes a set of contacts that surround the thermal pad, such as contacts 402, 403. A sacrificial strip of metal connects all of the contacts together and provides mechanical support until a sawing process removes it. An IC chip is attached to each thermal pad, such as IC chips 341, 342. Wire bonding may then be performed to connect bond pads on each IC to respective contacts on the lead frame. The entire lead frame strip 340 may then be covered with a layer of mold compound to encapsulate the ICs. Lead frame strip 340 may then be singulated into individual packaged ICs by cutting along cut lines 448, 449.

Notice that prior to cutting along lines 448, 449, contacts in adjacent leadframes are connected together. For example, contacts 402 and 403 are a single unit prior to cutting along cut line 449. Sawing the lead frame strip 340 produces the contact sidewalls of each QFN package; however, the resulting contact sidewalls are bare copper surfaces. These bare copper contact sidewalls are subject to oxidation which may prevent solder wetting, as discussed with regard to FIG. 2. A process that may be used to pre-tin the contact sidewall surfaces will now be described in more detail.

Figure 5A:
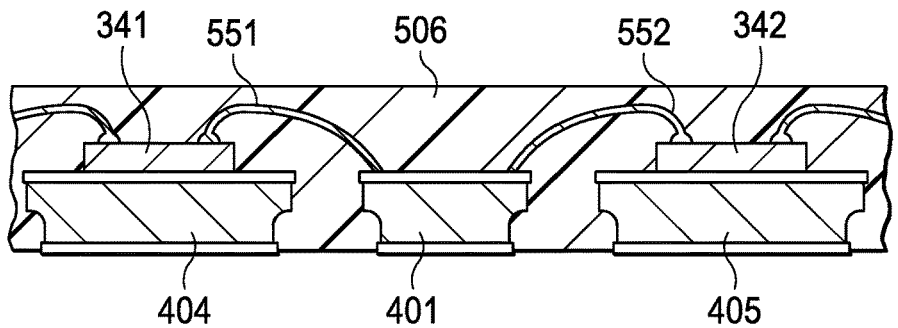
FIGS. 5A-5G illustrate a sequence of steps that may be used to pre-tin the contact sidewall surfaces of the QFN of FIG. 1.

FIGS. 5A-5G illustrate a sequence of steps that may be used to pre-tin the contact sidewall surfaces of QFN 100 of FIG. 1, for example. FIGS. 5A-5G are sectional views of a portion of lead frame strip 340, as shown in FIG. 4. FIG. 5A illustrates lead frame strip 340 after the encapsulation process. IC dies 341, 342 are attached to respective thermal pads 404, 405 using a known or later developed die attach process. Contact element 401 will be cut in a later step illustrated in FIG. 5B to form separate contacts 402, 403. Bond wire 551 connects a bond pad on IC die 404 to a portion of contact element 401 that will later become contact 402. Similarly, bond wire 552 connects a bond pad on IC die 405 to a portion of contact element 401 that will later become contact 403. Mold compound 506 has been applied to lead frame strip 340 using a known or later developed process.

Figure 5B:
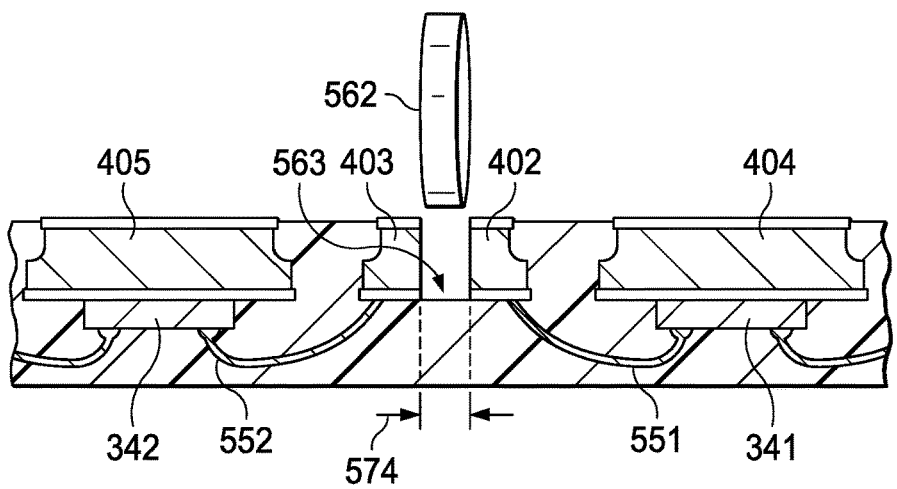

FIG. 5B illustrates a sawing process using a saw 562 to form a partial saw cut trench 563 that separates contact element 401 into separate contacts 402, 403. The sawing process forms a similar partial saw cut trench along each cut line 448, 449 (as shown in FIG. 4) over the entirety of lead frame 340. As explained above, sawing each contact element (such as contact element 401) into separate contacts (such as contacts 402, 403) forms a bare copper contact sidewall surface. The sacrificial metal may also be removed by the partial saw cut.

Partial saw cut trench 563 is deep enough to completely separate contacts 402, 403, and remove the sacrificial strip of metal between each contact, but shallow enough that encapsulated lead frame strip 340 remains in one piece.

Figure 5C:
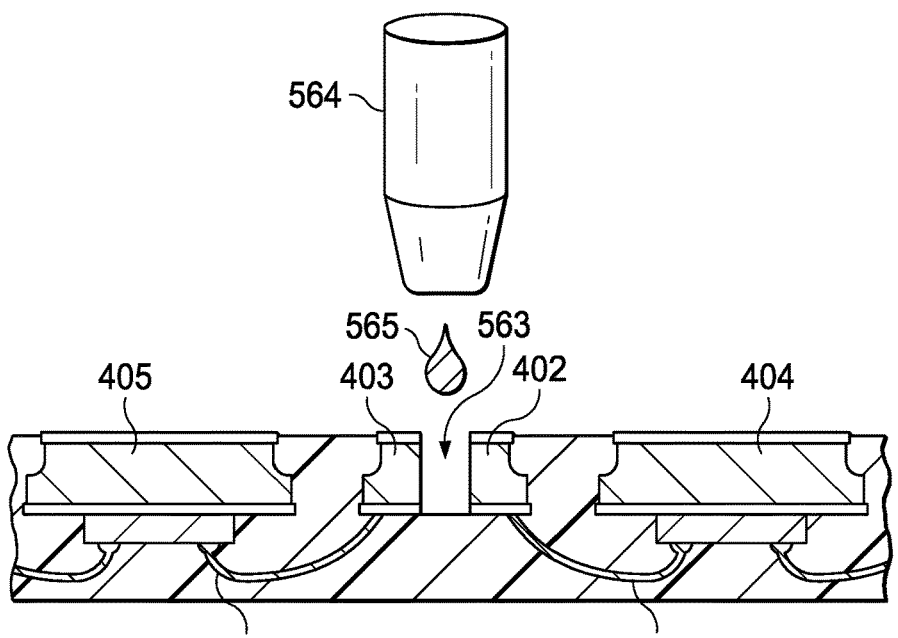
Figure 5D:
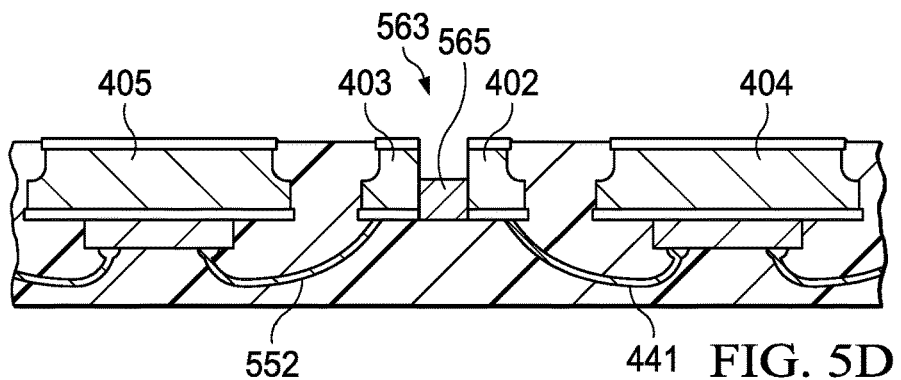
Figure 5E:
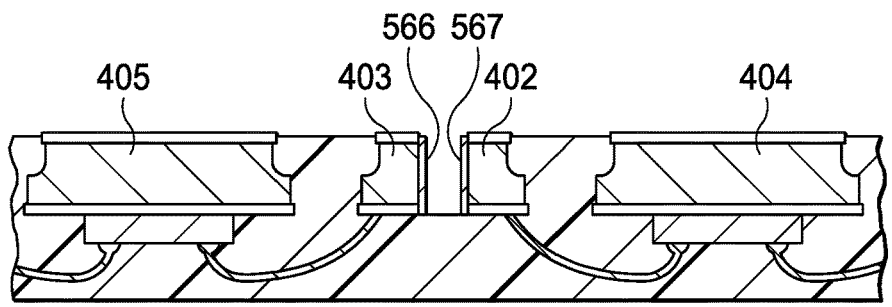

FIG. 5C illustrates a process of depositing a pre-tinning material 565 from dispenser 564 into partial saw cut trench 563. The term "pre-tinning material" refers to any type of material that may be used to form a protective layer over the bare contact sidewall surface to prevent oxidation or other contamination from forming on the bare contact sidewall surface. The protective layer of pre-tinning material provides a wettable surface for solder when the package is soldered to a PCB.

Pre-tinning material 565 may be a solder paste that may include a flux. In this case, dispenser 564 may be an MY600 solder jet printer, for example, which may also be used for dispensing solder paste dots onto a PCB.

In another embodiment, pre-tinning material 565 may be an ink that includes silver (Ag) nanoparticles. Silver nanoparticles are typically nanoparticles of silver of between 1 nm and 100 nm in size. While frequently described as being 'silver' some are composed of a large percentage of silver oxide due to their large ratio of surface-to-bulk silver atoms. A commonly used shape is a spherical silver nanoparticle; however, diamond, octagonal or other shapes may be used.

In this case, dispenser 564 may be a single or multi-nozzle ink jet dispenser. In some embodiments, ink jet dispenser 564 may have 500 to 1000 ink jet nozzles, for example. A reducing gas, such as formic acid, may be used to clean the bare copper contact sidewall surfaces prior to and/or during the deposition of nano-Ag ink.

Figured 5D and 5E illustrate a baking process in which the deposited pre-tinning material 565 is heated so that it reflows and wicks up the contact sidewall surfaces of contacts 402, 403 to wet the contact sidewalls and thereby form a pre-tinned layer 566, 567 that covers the entire contact sidewall surface of each contact 402, 403 with a protective layer of solder wettable material.

The baking temperature is selected to be high enough to cause the pre-tinning material to reflow, but not high enough to damage encapsulation material 506. If the pre-tinning material 565 is solder paste, a temperature in the range of approximately 200-280° C. may be used. If the pre-tinning material 565 is nano-Ag, a temperature in the range of approximately 150-250° C. may be used, for example.

While only two contacts 402, 403 are illustrated here, it is to be understood that all of the contacts on lead frame strip 340 are being processed in a similar manner.

Figure 5F:
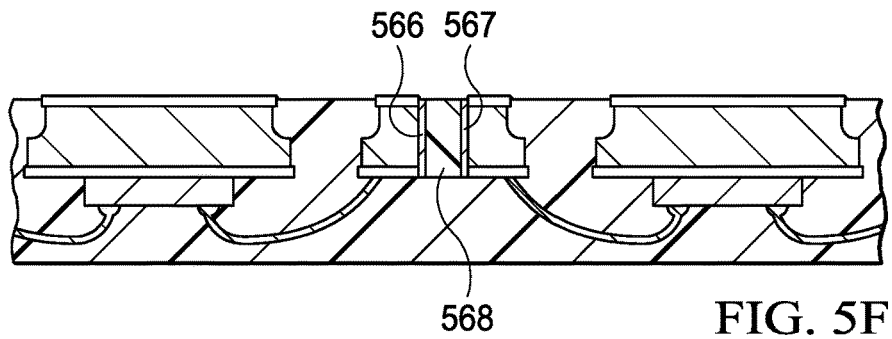

FIG. 5F illustrates a filling process in which the partial saw cut trenches 563 may be filled with a fill material 568. Fill material 568 may be an epoxy compound similar to mold compound 506, for example. Fill material 568 may be applied using a known or later developed printing process, for example. Filling the partial saw cut trenches 563 may result in a final QFN package that has smooth sides, for example.

Figure 5G:
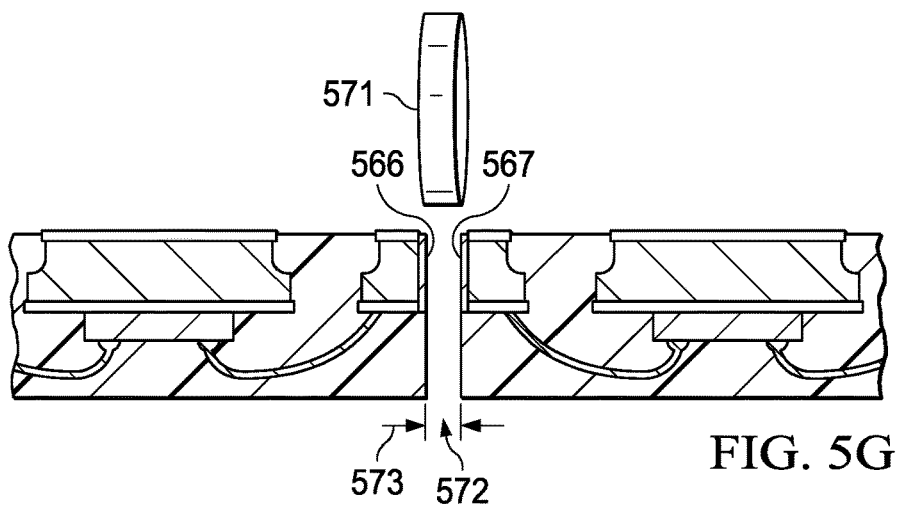

FIG. 5G illustrates a sawing process in which encapsulated lead frame strip 340 is singulated into individual QFN packages by completely sawing through cut lines 448, 449 (as shown in FIG. 4) using a saw 571.

Referring back to FIG. 5B, partial saw cut trench 563 has a width 574 that is wide enough to remove the sacrificial metal strip between each of the contacts that provided mechanical support prior to encapsulation. Saw 571 is selected to produce a kerf that has a width 573 that is narrower than width 574 of partial saw cut trench 563 so that at least a portion of pre-tinned layers 566, 567 remain on the contact sidewall surfaces of contacts 402, 403 to form a protective layer after each package is singulated.

Figure 6:
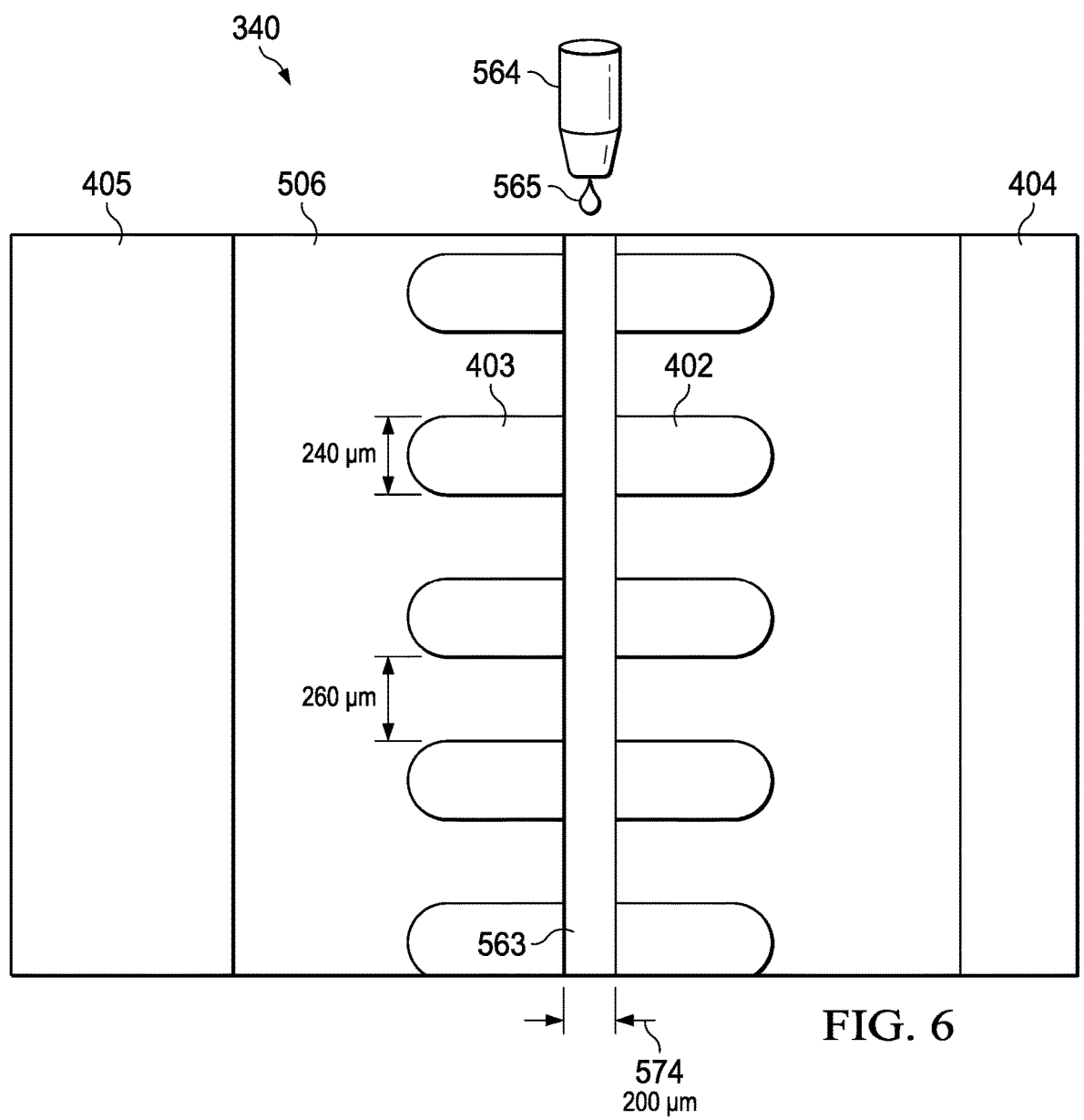
FIGS. 6 and 7 illustrate the use of an ink jet printer during fabrication of the QFN of FIG. 1.

FIG. 6 is an enlarged view of a portion of the bottom surface of lead frame 340. In this example, the contacts are approximately 240 μm wide, while the contact-contact spacing is approximately 260 μm. The width 574 of partial saw cut trench 563 is approximately 200 μm.

Figure 7:
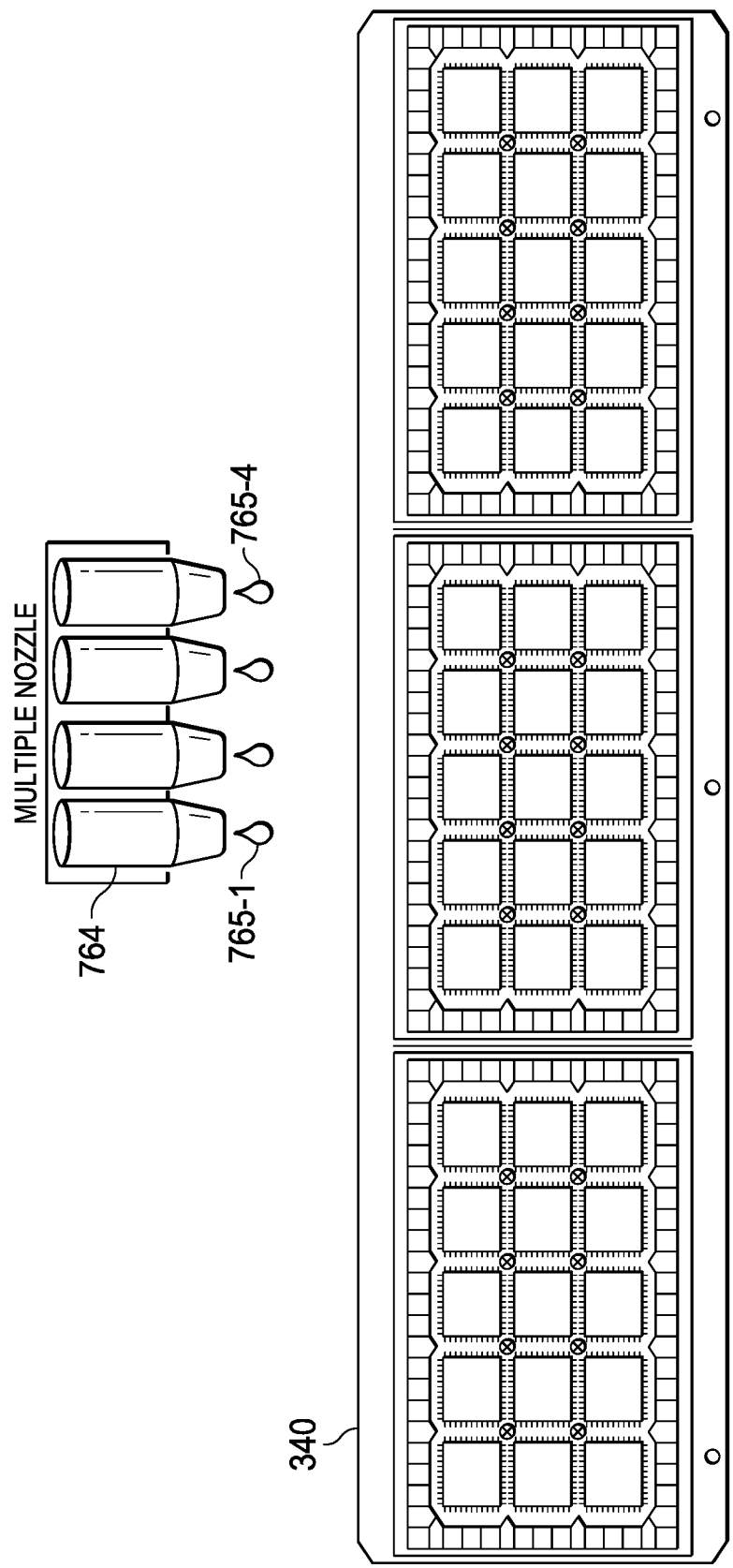

FIG. 7 illustrates the use of a multi-head ink jet printer during fabrication of the QFN of FIG. 1. As mentioned above, pre-tinning material 565 may be an ink that includes silver (Ag) nano-particles. In this case, dispenser 564 may be a single or multi-nozzle ink jet dispenser. In some embodiments, ink jet dispenser 564 may have 500 to 1000 ink jet nozzles, for example. A reducing gas, such as formic acid, may be used to clean the bare copper contact sidewall surfaces prior to and/or during the deposition of nano-Ag ink.

Figure 8:
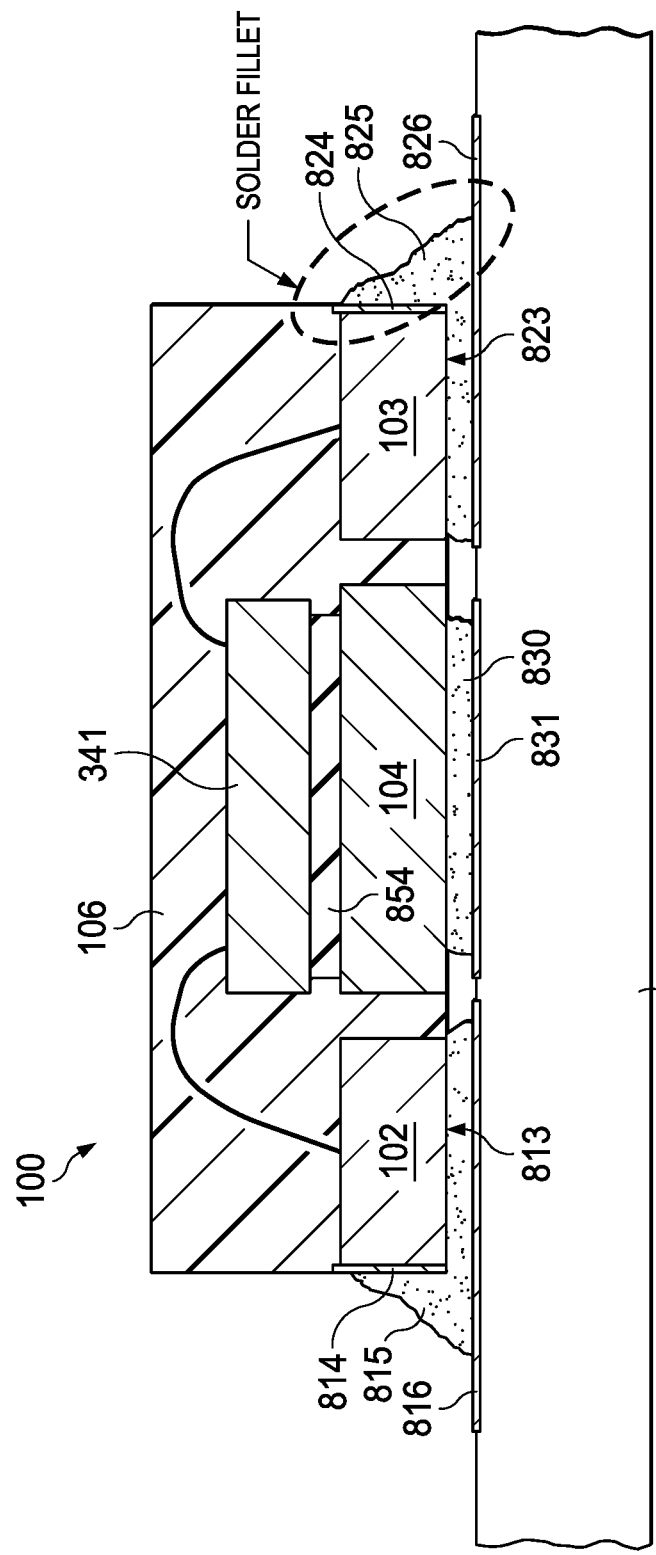
FIG. 8 illustrates a side view of the QFN of FIG. 1 soldered onto a PCB.

FIG. 8 illustrates a sectional side view of the QFN 100 of FIG. 1 soldered onto a PCB 810. QFN includes a leadframe that has a thermal pad 104 and a set of contacts that surround thermal pad 104, as represented by contacts 102, 103. Each of the contacts has an exposed surface on the bottom side of QFN package 100 and an exposed sidewall. For example, contact 102 has an exposed lower surface 813 on the bottom side of QFN package 100 and an exposed contact sidewall 814. Similarly, contact 103 has an exposed lower surface 823 on the bottom side of QFN package 100 and an exposed contact sidewall 824. Each contact sidewall surface has been pre-tinned by the process described in more detail with regards, to FIGS. 5A-5G. IC die 341 is attached to thermal pad 104 using a known or later developed die attach material 854.

Contact 102 is connected to pad 816 on PCB 810 by solder 815. Similarly, contact 103 is connected to pad 826 on PCB 810 by solder 826. Thermal pad 104 may be connected to pad 831 by solder 830. PCB 810 mechanically supports and electrically connects electronic components using conductive tracks, pads and other features etched from copper sheets laminated onto a non-conductive substrate. Components (e.g. capacitors, resistors, or active devices) are generally soldered on the PCB. Advanced PCBs may contain components embedded in the substrate.

PCB 810 may be single sided (one copper layer), double sided (two copper layers), or multi-layer (outer and inner layers). Conductors on different layers may be connected with vias. Glass epoxy is a primary insulating substrate; however various embodiments may use various types of known or later developed PCBs.

As described above in more detail, by pre-tinning the contact sidewall surfaces of QFN 100, such as contact sidewall surface 814, 824, each contact solder joint will wick up the contact sidewall surface and form a fillet, as illustrated by solder joints 815, 825. AVI may then be able to reliably determine if a proper solder joint has been formed.

Figure 9:
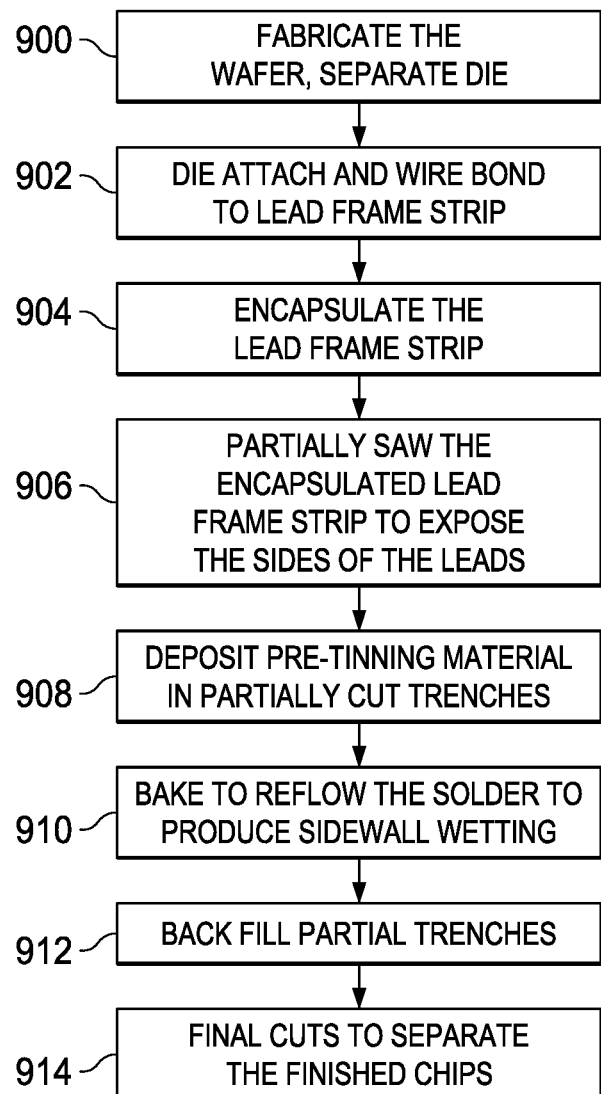
FIG. 9 is a flow chart illustrating packaging of a QFN IC.

FIG. 9 is a flow chart illustrating fabrication of a QFN IC. A semiconductor wafer may be fabricated to form a set of integrated circuits, which may then be singulated into individual die using known or later developed processing technology, as indicated in box 900.

A set of die may then be attached to a single lead frame strip and wire bonded to contacts on the lead frame strip using known or later developed die attach processing, as indicated in box 902.

The entire lead frame strip may then be encapsulated using a mold compound as indicated at box 904, using known or later developed encapsulation material.

The encapsulated lead frame strip may then be partially sawed as indicated in box 906 to form a partial saw cut trench between each individual lead frame, as described in more detail with regard to FIGS. 4 and 5B. Each partial saw cut trench is deep enough to completely separate the contacts between adjacent individual lead frames and remove the sacrificial strip of metal between each contact, but shallow enough that the encapsulated lead frame strip remains in one piece.

Pre-tinning material may be dispensed from a dispenser into the partial saw cut trenches as indicated at box 908. The pre-tinning material may be a solder paste that may include a flux, an ink that includes silver (Ag) nano-particles, etc. A reducing gas, such as formic acid, may be used to clean the bare copper contact sidewall surfaces prior to and/or during the deposition of nano-Ag ink.

A baking process may be performed as indicated at box 910 in which the deposited pre-tinning material is heated so that it reflows and wicks up the contact sidewall surfaces of the contacts to wet the contact sidewalls and thereby form a pre-tinned layer that covers the entire contact sidewall surface of each contact.

A back-filling process may be performed as indicated in box 912 in which the partial saw cut trenches may be filled with a fill material. The fill material may be an epoxy compound similar to the mold compound used in step 904, for example. The fill material may be applied using a known or later developed printing process, for example. Filling the partial saw cut trenches may result in a final QFN package that has smooth sides, for example.

A sawing process may be performed as indicated in box 914 in which the encapsulated lead frame strip is singulated into individual QFN packages by completely sawing between each individual lead frame using a known or later developed sawing process. The partial saw cut trenches formed in step 906 has a width that is wide enough to remove the sacrificial metal strip between each of the contacts that provided mechanical support prior to encapsulation. The final saw process is selected to produce a kerf that has a width that is narrower than the width of partial saw cut trench so that at least a portion of the pre-tinned layer remains on the contact sidewall surfaces of the contacts.

A previous solution to the problem of contact sidewall oxidation performed a partial cut that did not completely separate the adjacent contacts, followed by an electroplating operation. The contacts could not be completely separated because electrical conductivity to each contact was required to perform the electroplating. Thus, after singulation a portion of the contact sidewall surface was bare copper that was subject to oxidation. Embodiments of the present disclosure overcome the problems resulting from oxidation of just a portion of the contact sidewall surface.

OTHER EMBODIMENTS

While the disclosure has been described with reference to illustrative embodiments, this description is not intended to be construed in a limiting sense. Various other embodiments of the disclosure will be apparent to persons skilled in the art upon reference to this description. For example, while nano-Ag ink is disclosed herein as a pre-tinning material, other types of conductive ink may be used, such as tin nanoparticles, gold nanoparticles, etc.

While an example embodiment based on a QFN package has been described herein, other embodiments may use other leadless configurations, such as a dual flat no lead package (DFN), a single flat no lead package, a top exposed pad leadless package, thin and ultra thin leadless packages, etc.

While sawing was described herein to singulate the finished lead frame strip, another embodiment may use other techniques for singulation, such as laser cutting, water jet cutting, etc.

While a copper lead frame strip was described herein, other embodiments may use lead frames constructed from other electrically conductive metals or non-metallic materials that are subject to oxidation.

While tin plating of the surface of the lead frame was described herein to protect the exposed contact lower surface, another embodiment may treat the surface of the lead frame strip using another material that prevents oxidation of the lead frame surface and that is solder wettable.

While a glass epoxy printed circuit board that may have several interconnect layers was described herein, another embodiment may use a different substrate, such as a multi-layer ceramic, etc.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the disclosure should not be considered limited to the specific ordering of steps shown in the figures and/or described herein.

It is therefore contemplated that the appended claims will cover any such modifications of the embodiments as fall within the true scope and spirit of the disclosure.

What is claimed is:

1. An integrated circuit (IC) package comprising:
   an encapsulation package containing an integrated circuit die attached to a lead frame;
   a set of contacts each having a contact sidewall surface and a contact lower surface; and
   a protective layer of wicked-up material covering each contact sidewall surface.

2. The IC package of claim 1, in which the protective layer of wicked-up material includes silver nanoparticles.

3. The IC package of claim 1, in which the protective layer of wicked-up material is solder.

4. The IC package of claim 1, in which the lead frame is copper.

5. The IC package of claim 1, in which each exposed contact lower surface is covered with tin plating.

6. An integrated circuit package, comprising:
   an encapsulation package containing an integrated circuit die attached to a lead frame; and
   a set of contacts each having a contact sidewall surface and a contact lower surface, wicked-up pre-tinning material covering the contact sidewall surfaces.

7. The integrated circuit package of claim 6, in which electrical contacts on the integrated circuit die are electrically connected to respective ones of the set of contacts.

8. The integrated circuit package of claim 6, in which the layer of wicked-up pre-tinning material includes silver nanoparticles.

9. The integrated circuit package of claim 7, in which the layer of wicked-up pre-tinning material includes silver nanoparticles.

10. The integrated circuit package of claim 6, in which the layer of wicked-up pre-tinning material is solder.

11. The integrated circuit package of claim 7, in which the layer of wicked-up pre-tinning material is solder.

12. The integrated circuit package of claim 6, in which the wicked-up pre-tinning material is deposited using an ink jet printer.

13. The integrated circuit package of claim 7, in which the wicked-up pre-tinning material is deposited using an ink jet printer.

14. The integrated circuit package of claim 6, in which the lead frame is copper.

15. The integrated circuit package of claim 7, in which the lead frame is copper.

16. The integrated circuit package of claim 6, in which each exposed contact lower surface is covered with tin plating.

17. The integrated circuit package of claim 7, in which each exposed contact lower surface is covered with tin plating.

* * * * *